United States Patent [19]

Corder et al.

[11] Patent Number: 5,033,834
[45] Date of Patent: Jul. 23, 1991

[54] MICROSCOPE SPECIMEN MOUNT CONVERTER

[75] Inventors: Loren D. Corder, Melba; Burgess G. Gudmundson, Boise, both of Id.

[73] Assignee: Micron Technology, Inc., Boise, Id.

[21] Appl. No.: 302,777

[22] Filed: Jan. 30, 1989

[51] Int. Cl.[5] .................... G02B 7/00; G02B 21/00
[52] U.S. Cl. .................... 350/529; 350/532; 350/536
[58] Field of Search ............. 350/507, 511, 512, 518, 350/521, 522, 528, 529–536; 250/440.1–442.1, 311, 491.1, 306, 399

[56] References Cited

U.S. PATENT DOCUMENTS

| | | | |
|---|---|---|---|
| 1,798,634 | 3/1931 | Willy | 350/532 |
| 2,041,290 | 5/1936 | Jackson | 350/536 |
| 3,919,553 | 11/1975 | Cohen et al. | 250/306 |
| 4,117,323 | 9/1978 | Greer et al. | 250/399 |
| 4,589,743 | 5/1986 | Clegg | 350/536 |
| 4,710,633 | 12/1987 | Suzuki | 250/440.1 |
| 4,745,297 | 5/1988 | Sullivan et al. | 250/440.1 |
| 4,797,261 | 1/1989 | Swann et al. | 250/442.1 |
| 4,837,444 | 6/1989 | Ohi | 250/440.1 |

*Primary Examiner*—Bruce Y. Arnold
*Assistant Examiner*—Thong Nguyen
*Attorney, Agent, or Firm*—Stanley N. Protigal; Angus C. Fox; Jon P. Busack

[57] ABSTRACT

Apparatus to convert a single-mount SEM microscope stage into a multi-mount SEM microscope stage. The apparatus interfits onto the conventional center-aperture SEM microscope stage, and provides a mounting face having apertures for multiple-specimen mounts. The device is able to provide top or side views of the specimen with only a 45° rotation of the microscope stage from its starting point.

14 Claims, 3 Drawing Sheets

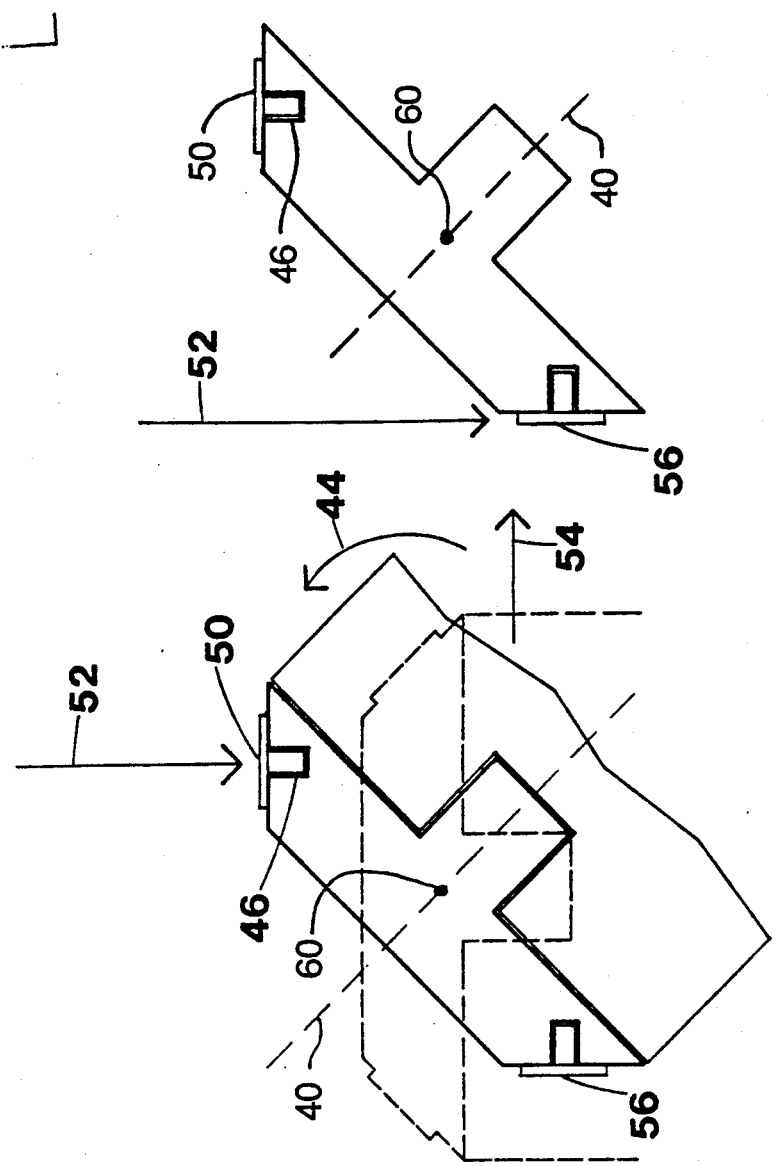
FIG. 4B
FIG. 4A
FIG. 3
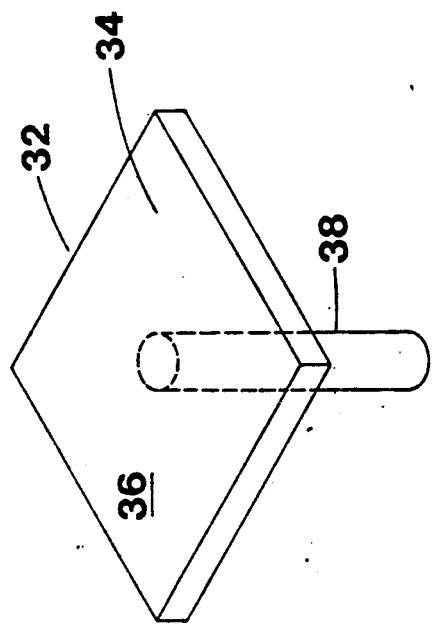

MICROSCOPE SPECIMEN MOUNT CONVERTER

BACKGROUND OF THE INVENTION

Scanning electron microscopes (SEM) are useful research tools which permit microscopic evaluation of samples with much greater resolution and magnification than that possible with conventional light microscopes. However, the procedure necessary to set up and observe numerous samples is cumbersome and requires a great deal of operator time merely to prepare for the microscopic examination.

For instance, conventional electron microscopes are provided with a microscope stage having a planar operative upper surface within which is mounted the sample for observation. In one embodiment, the microscope stage is provided with an aperture into which a sample carrier is placed, with the sample for observation being securely affixed to the upper surface of the carrier. A longitudinal axis through the center line of the aperture is disposed perpendicular to the surface of the microscope stage. Typically, the electron beam from the SEM is focused about this axis which is perpendicular to the microscope stage. In order to observe the specimen in a cross-section, the entire stage must be rotated 90° so that the electron beam will enter the "side" of the specimen as opposed to the "top".

While conventional procedures certainly perform adequately for their intended result, the amount of time needed to replace individual samples on a microscope stage, and the 90° rotation of the stage for cross-sectional views of the specimen, involve an inordinate amount of preparatory time prior to actually making the observation with the SEM. Therefore, Applicants have identified a need for an apparatus which is capable of converting conventional SEM microscope stages from a single-specimen stage to a multiple-specimen stage, in order to permit the microscope operator to insert a number of samples simultaneously into the observation chamber, thereby substantially reducing the setup time necessary for a number of samples. Likewise, Applicants have identified a need for an apparatus to eliminate the need to rotate the SEM microscope stage a full 90° in order to make cross-sectional observations.

Therefore, the apparatus of the present invention enables the SEM operator to insert a plurality of samples for observation simultaneously into the observation chamber.

SUMMARY OF THE INVENTION

The present invention comprises an apparatus which will convert a single-specimen electron microscope stage into a multiple-specimen microscope stage. The apparatus is adapted to fit into the aperture provided in conventional SEM microscope stages without the need for additional securing means. The apparatus of the present invention comprises a planar plate member having a pin depending therefrom, the pin fitting into the aperture provided in the conventional microscope stage, and the plate member lying upon the upper surface of the microscope stage. The plate member is constructed so that the exterior edge portion (or mounting face) defines an inclusive acute angle relative to the upper surface of the microscope stage. A plurality of mounting apertures are provided in the mounting face. The apertures extending into the plate member. The mounting apertures are provided such that an axis therethrough is aligned at about a 45° angle to the surface of the microscope stage and the axis of the aperture provided in the microscope stage. A plurality of such mounting apertures are provided equally spaced about the periphery of the mounting face.

Specimen holders are provided which are adapted to fit into the mounting apertures and against the mounting face. Preferably, such specimen holders comprise a planar surface onto which the specimen may be mounted, and a pin member depending therefrom and adapted to securely fit into the mounting apertures. When placed within the mounting aperture, the planar mounting surface overlies the mounting face.

SEM microscope stages are typically adjustable within a 90° arc so that the specimen may be viewed from the side in order to observe a cross-sectional view. By placing the specimen on a mounting face aligned at a 45° angle when in the loading position, the microscope mount of this invention need only be rotated 45° after its insertion to make either a "top" or "side" (cross-sectional) view.

BRIEF DESCRIPTION OF THE DRAWINGS

FIG. 3 is an isometric view of the specimen holder of the present invention; and FIGS. 4A and 4B are side views of the apparatus of the present invention illustrating rotation about a "Z" axis.

DETAILED DESCRIPTION OF THE INVENTION

Figure 1:
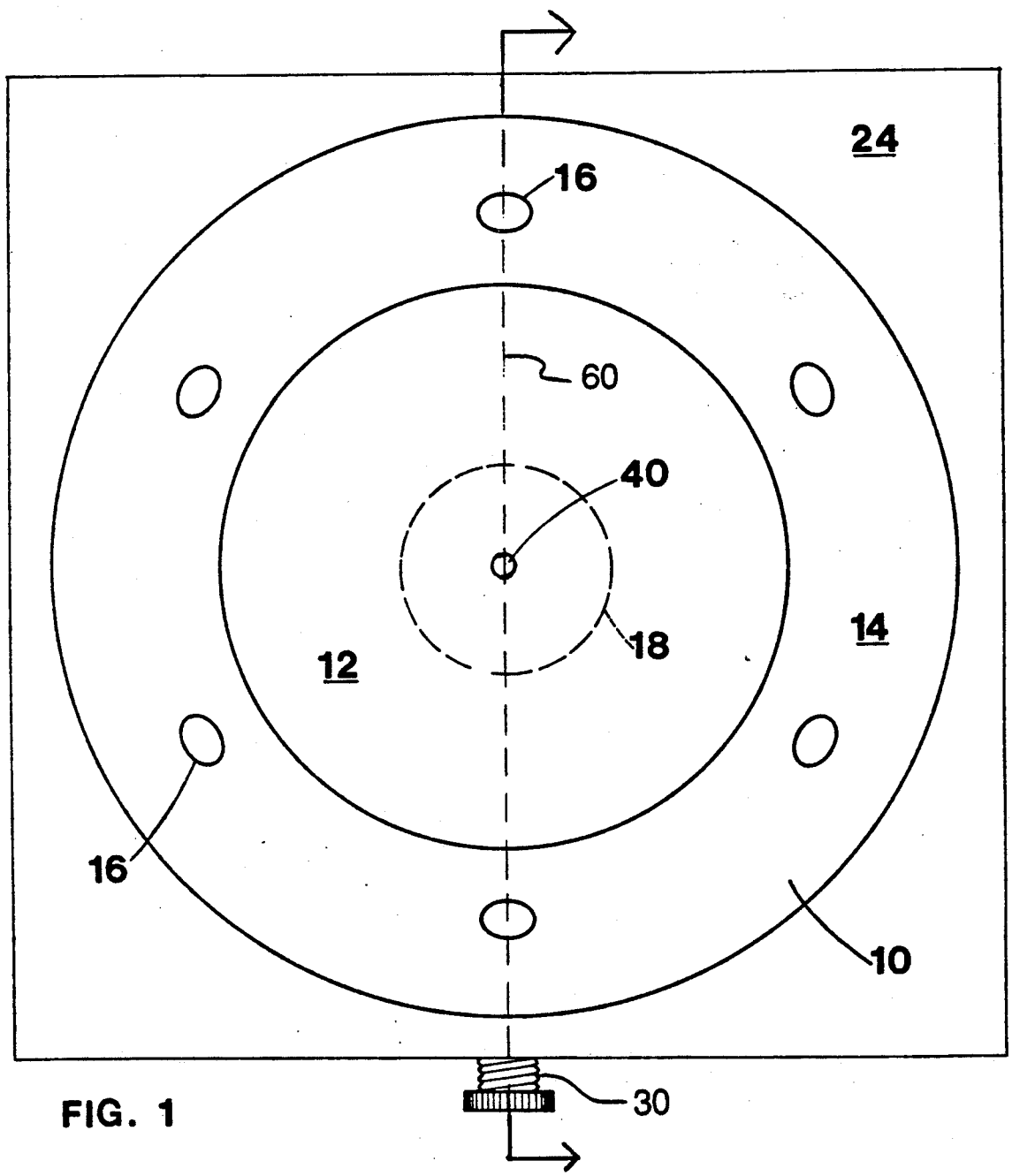
FIG. 1 is a plan view of the apparatus of the present invention.

As illustrated generally in FIG. 1, the apparatus of the present invention comprises a multiple-specimen microscope mount 10 which comprises a planar portion having an upper surface 12 a mounting face 14 and a plurality of mounting apertures 16 within the mounting face 14. Depending from the underside of the device 10 is a pin 18.

As illustrated in FIG. 1, the apparatus of the present invention is illustrated with six equally-spaced mounting apertures 16. It is to be appreciated that the advantages of the present invention can be realized by providing any number of mounting apertures on the mounting face 14, subject only to space constraints as noted below. It is desirable that the mounting apertures 16 be equally spaced about the mounting face 14 so that automatic mechanical indexing means (not shown) may be installed upon the SEM microscope stage to rotate the stage between the numerous specimens mounted on the inventive apparatus. Applicants have found that six mounting apertures spaced 60° (on the centerline) apart provide adequate space and sufficiently increase productivity.

Figure 2:
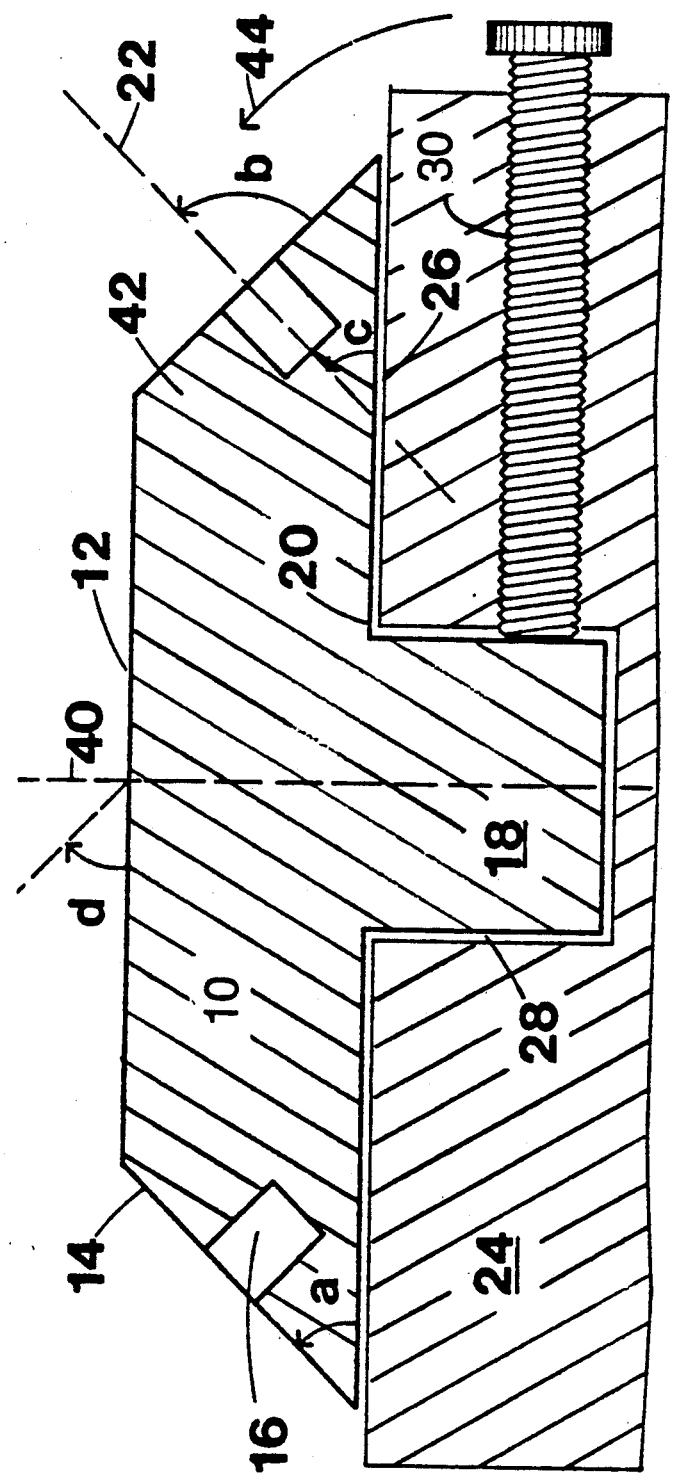
FIG. 2 is a sectional side view of the apparatus of the present invention taken along line 2—2 of FIG. 1.

As shown in FIG. 2, the device 10 is provided with a mounting face 14 at an angle "a" to the lower surface 20. As the lower surface 20 lies adjacent an upper surface 26 of the microscope stage, the angle "a" defines an inclusive angle between the mounting face and the microscope stage. When, for instance, the mounting apertures 16 are provided with a first centerline axis 22 therethrough perpendicular to the mounting face 14 (angle "b" is therefore 90°), the mounting apertures 16 will be aligned at a 45° angle ("c") to the microscope stage. As illustrated in FIG. 2, the microscope stage 24 is provided with an upper planar operative surface 26 and a specimen-retaining aperture 28 therein. As illustrated, the lower surface 20 of the device 10 abuts the upper surface 26 of the microscope stage 24, while the pin 18 is secured within aperture 28. Any conventional means well-known to those skilled in this art may be used to secure the pin within aperture 28, such as the use of frictional O-rings, or a set screw 30, as illustrated.

Specimen holders, generally designated 32 in FIG. 3, are provided for attachment to the device 10. The specimen holder comprises a planar mounting member 34, having an upper surface 36, and a mounting pin 38 depending from the underside thereof. The pin 38 is adapted to fit within the mounting aperture 16, with the lower surface of the planar mounting member 34 abutting against the mounting face 14. Specimens for observation are securely affixed to the upper surface 36 of member 34. The device may be configured with apertures 16 adapted to accept standard ⅛| diameter pin mount specimen holders, such as those conventionally provided for use with Amray and other SEMs.

Operation of the apparatus of the present invention does not require modification to existing SEM microscope stages. A conventional microscope stage as illustrated in FIG. 2 (such as the stage provided with a model JSM840 SEM manufactured by the Japan Electron Optics Laboratory), is provided with a specimen-retaining aperture 28 having a diameter of approximately 12.3 mm. Therefore, the pin 18 of the device 10 is manufactured having a diameter suitable to fit aperture 28, or slightly less than about 12.3 mm. As the conventional square microscope stage is about 75-100 mm on a side, the device of the present invention is provided with a maximum diameter of approximately 2.5 inches.

Conventionally, as a single specimen is mounted into the aperture 28 for viewing under the SEM, the specimen chamber is closed, vented, and pumped down to the required vacuum prior to exposure to the electron beam. Such procedure requires several minutes to complete for each sample. The procedure must be repeated for each specimen observed. Therefore, the ability to insert several specimens simultaneously would significantly shorten the required set up time.

In order to make an observation from the side of the specimen using a conventional SEM microscope stage, the microscope stage must be rotated 90°. However, use of the present invention eliminates both problems. A plurality of specimens are provided with a single load of the chamber, and with a single vacuum pumpdown, subject only to being rotated into position under the electron beam. Because the samples are aligned at an angle of 45° (angle "c") to the electron beam when inserted (the electron beam being coincident with a second axis 40 of aperture 28), rotation of the stage need only be 45° (angle "d" of FIG. 2) from the line of the electron beam rather than 90° as required previously.

As illustrated in FIG. 4A, rotation of the mount 45° in the direction of arrow 44 about (the "Z" axis) causes the specimen 50 contained in aperture 46 to be aligned in the "top view" position, facing upwardly and directly beneath the electron beam 52. Assuming the specimens are arranged diametrically opposed to one another on the mount 10, by moving the entire stage laterally in the direction of arrow 54, (the "X" or "Y" axis) will cause the specimen 56 diametrically opposed to specimen 50 to be aligned in a side, or cross-sectional view to the electron beam 52. Therefore, a 45° rotation of the stage coupled with conventional lateral movement of the stage will effect a 90° rotation in the available views. Top views of all the specimens may be taken at one time by racheting the stage about axis 40, bringing adjacent specimens sequentially into position beneath the electron beam 52. Thereafter, all the side views may be taken sequentially by moving the stage in the direction of arrow 54 and again racheting the stage about axis 40. It is contemplated that conventional means are provided for independent movement of the stage in "X" or "Y" axis 54 or rotation about the "Z" axis 60.

While the mount is described above in terms of 45° angles, or multiples thereof, it should be understood that such is a preferred embodiment and any angular configuration could be adapted. However, for ease of automatic or remote control, multiples of 45° offer the greatest uniformity and precision.

Of course, the specimen mounted to the specimen holder 32 must be secured thereto, as with carbon paint or other materials well-known to those of ordinary skill in this art. Likewise, the specimen holders 32 must be secured to the mounting face 14 (as with carbon paint) in order to prevent movement either prior to or during observation with the SEM. The device 10 is preferably constructed of a soft conductive metal, such as aluminum or brass. Sufficient space must be provided between adjacent apertures 16 such that specimen holders 32 can be placed adjacent one another on the mounting face 14.

While a preferred embodiment of the invention has been disclosed, various modes of carrying out the principles disclosed herein are contemplated as being within the scope of the following claims. Therefore, it is understood that the scope of the invention is not to be limited except as otherwise set forth in the claims.

We claim:

1. Apparatus for converting a single-specimen microscope mount into a multiple-specimen microscope mount, for mounting onto a microscope stage having a planar operative surface, said multiple-specimen microscope mount comprising:
    a. means to attach the multiple-specimen microscope mount to the microscope stage;
    b a mounting face disposed at an acute angle to the planar operative surface of the microscope stage;
    c. a plurality of mounting apertures radially oriented and equally spaced apart within the mounting face, and having a first axis therethrough; and
    d. a plurality of specimen holders adapted to fit within said plurality of apertures.

2. The apparatus as recited in claim 1, wherein the microscope stage is provided with a specimen-retaining aperture and means to attach the multiple-specimen microscope mount comprises a pin adapted to fit with said specimen-retaining aperture.

3. The apparatus as recited in claim 1, wherein the mounting face is aligned at an inwardly inclusive acute angle relative to the planar operative surface of the microscope stage.

4. The apparatus as recited in claim 3, wherein the plurality of mounting apertures are aligned such that the first axis therethrough is aligned at an angle of about 45o relative to the planar operative surface of the microscope stage.

5. The apparatus as recited in claim 1, wherein the specimen holder comprises a planar mounting surface and means to attach the specimen holder to the mounting face.

6. The apparatus as recited in claim 5, wherein the means to attach the specimen holder to the mounting face comprises a pin fitting into the mounting apertures in the mounting face, said planar mounting surface being disposed adjacent the mounting face.

7. In combination, an adjustable microscope stage having a planar operative surface and a multiple-specimen microscope mount, said combination comprising:
   a. means to attach the multiple-specimen microscope mount onto said microscope stage;
   b. a plurality of mounting apertures radially oriented and equally spaced apart about the periphery of the multiple-specimen microscope mount, each of said mounting apertures having a first longitudinal axis therethrough aligned at an angle of about 45° relative to the planar operative surface of the microscope stage; and
   c. a plurality of specimen holders adapted to fit within said plurality of mounting apertures.

8. The apparatus as recited in claim 7, wherein the microscope stage is provided with a specimen-retaining aperture and the means to attach the multiple-specimen microscope mount comprises a pin adapted to fit into said specimen-retaining aperture.

9. The combination of claim 7, wherein the multiple-specimen microscope mount is provided with a mounting face disposed at an acute angle to the planar operative surface of the microscope stage.

10. A combination of claim 9, wherein the mounting face is aligned with an inwardly inclusive acute angle relative to the planar operative surface of the microscope stage.

11. The combination of claim 10, wherein the plurality of mounting apertures are provided in the mounting face.

12. An apparatus for converting a single-specimen microscope mount into a multiple-specimen microscope mount, for mounting onto a microscope stage having a planar operative surface, said multiple-specimen microscope mount comprising:
   a. means to attach the multiple-specimen microscope mount to the microscope stage;
   b. a mounting face disposed at an inwardly acute angle to the planar operative surface of the microscope stage;
   c. a plurality of mounting apertures radially oriented and equally spaced apart within the mounting face, and having a first axis therethrough defining an angle of about 45° with the planar operative surface of the microscope stage; and
   d. a plurality of specimen holders adapted to fit within said plurality of apertures.

13. The apparatus as recited in claim 12, wherein the microscope stage is rotatable around a second axis aligned perpendicular to the planar operative surface.

14. The apparatus as recited in claim 13, wherein the microscope stage is provided with ratchet means to rotatably align each specimen holder with an electron beam.

* * * * *

UNITED STATES PATENT AND TRADEMARK OFFICE
CERTIFICATE OF CORRECTION

PATENT NO. : 5,033,834

DATED : July 23, 1991

INVENTOR(S) : Loren D. Corder et al.

It is certified that error appears in the above—identified patent and that said Letters Patent is hereby corrected as shown below:

Column 3, line 19, delete "1/8 | " and insert
-- 1/8" --.

Column 3, line 46, delete "speoimen" and insert
-- specimen --.

Column 4, line 54, delete "with" and insert
-- into --.

Column 4, line 63, delete "45o" and insert
-- 45° --.

Column 5, line 20, delete "apparatus" and insert
-- combination --.

Signed and Sealed this

Eleventh Day of January, 1994

Attest:

BRUCE LEHMAN

*Attesting Officer*     *Commissioner of Patents and Trademarks*